US012628391B2

(12) United States Patent
Li et al.

(10) Patent No.: US 12,628,391 B2
(45) Date of Patent: May 12, 2026

(54) METHOD FOR MANUFACTURING SEMICONDUCTOR AND SEMICONDUCTOR

(71) Applicant: INSTITUTE OF MICROELECTRONICS, CHINESE ACADEMY OF SCIENCES, Beijing (CN)

(72) Inventors: Junjie Li, Beijing (CN); Enxu Liu, Beijing (CN); Na Zhou, Beijing (CN); Jianfeng Gao, Beijing (CN); Junfeng Li, Beijing (CN); Jun Luo, Beijing (CN); Wenwu Wang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 418 days.

(21) Appl. No.: 18/529,487

(22) Filed: Dec. 5, 2023

(65) Prior Publication Data

US 2024/0194737 A1 Jun. 13, 2024

(30) Foreign Application Priority Data

Dec. 8, 2022 (CN) .......................... 202211576204.0

(51) Int. Cl.
$H10D\ 62/13$ (2025.01)
$H10D\ 30/01$ (2025.01)
$H10D\ 30/43$ (2025.01)
$H10D\ 30/67$ (2025.01)

(52) U.S. Cl.
CPC ......... $H10D\ 62/151$ (2025.01); $H10D\ 30/014$ (2025.01); $H10D\ 30/031$ (2025.01); $H10D\ 30/43$ (2025.01); $H10D\ 30/6757$ (2025.01)

(58) Field of Classification Search
CPC .. H10D 62/151; H10D 30/014; H10D 30/031; H10D 30/43; H10D 30/6757
See application file for complete search history.

(56) References Cited

U.S. PATENT DOCUMENTS

2022/0190159 A1* 6/2022 Paul ..................... H10D 30/014

* cited by examiner

*Primary Examiner* — Samuel A Gebremariam
(74) *Attorney, Agent, or Firm* — Christopher R. Christenson; Kelly, Holt & Christenson, P.L.L.C.

(57) ABSTRACT

A method for manufacturing a semiconductor and a semiconductor. The method includes: providing a substrate, wherein an active region trench is on the substrate, and a channel stack of a gate-all-around transistor is formed in the active region trench, the active region trench is divided into a source trench and a drain trench by the channel stack; epitaxially growing a source crystal structure in the source trench and a drain crystal structure in the drain trench, and stopping epitaxial growth before crystal planes with different orientations of the source crystal structure intersect and crystal planes with different orientations of the drain crystal structure intersect; and filling gaps between the crystal planes with different orientations of the source crystal structure and the drain crystal structure by using an isotropic metal material, and forming a source and a drain of the gate-all-around transistor in the source trench and the drain trench, respectively.

10 Claims, 5 Drawing Sheets

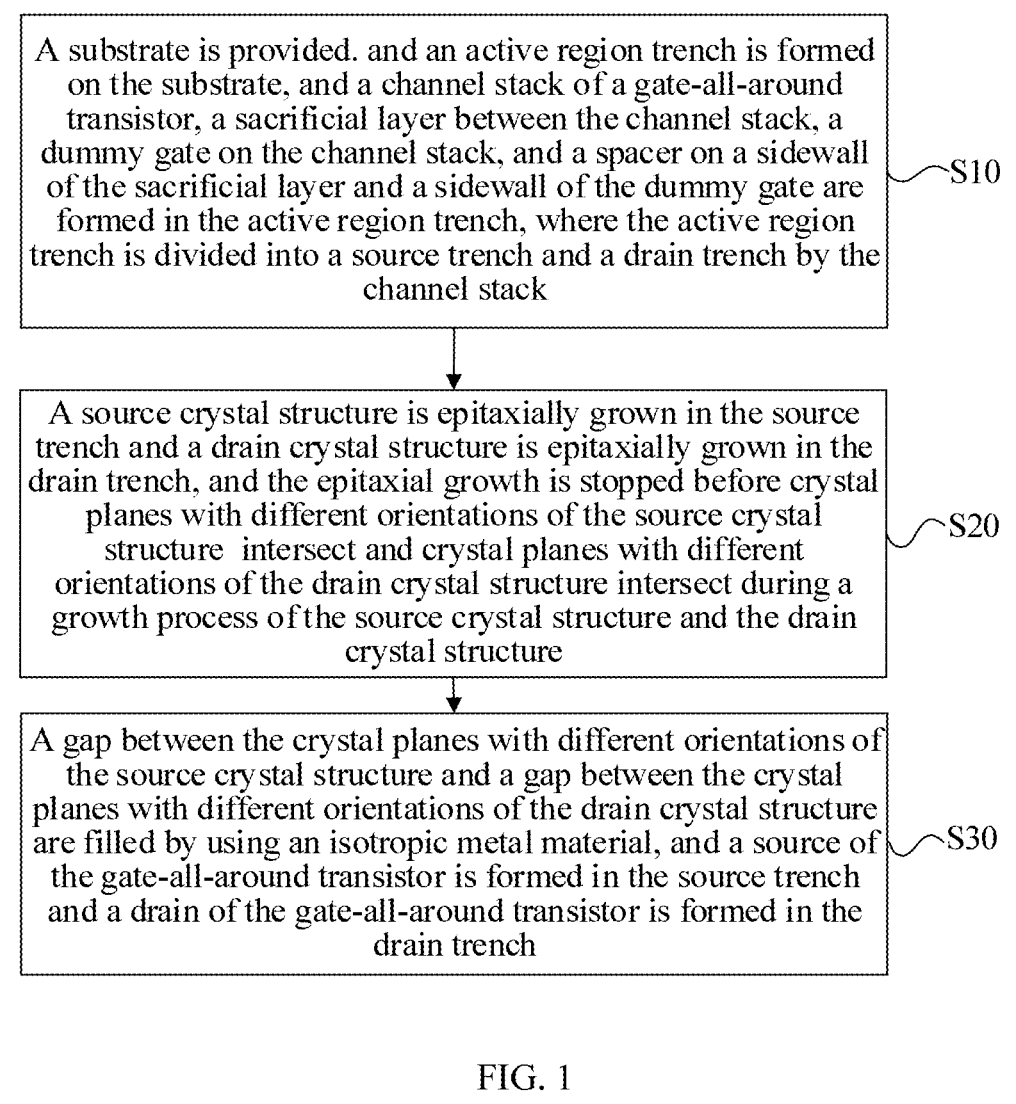

A substrate is provided. and an active region trench is formed on the substrate, and a channel stack of a gate-all-around transistor, a sacrificial layer between the channel stack, a dummy gate on the channel stack, and a spacer on a sidewall of the sacrificial layer and a sidewall of the dummy gate are formed in the active region trench, where the active region trench is divided into a source trench and a drain trench by the channel stack ⟋S10

A source crystal structure is epitaxially grown in the source trench and a drain crystal structure is epitaxially grown in the drain trench, and the epitaxial growth is stopped before crystal planes with different orientations of the source crystal structure intersect and crystal planes with different orientations of the drain crystal structure intersect during a growth process of the source crystal structure and the drain crystal structure ⟋S20

A gap between the crystal planes with different orientations of the source crystal structure and a gap between the crystal planes with different orientations of the drain crystal structure are filled by using an isotropic metal material, and a source of the gate-all-around transistor is formed in the source trench and a drain of the gate-all-around transistor is formed in the drain trench ⟋S30

FIG. 1

METHOD FOR MANUFACTURING SEMICONDUCTOR AND SEMICONDUCTOR

CROSS REFERENCE TO RELATED APPLICATION(S)

This application claims priority to Chinese Patent Application No. 202211576204.0, filed on Dec. 8, 2022 and entitled "METHOD FOR MANUFACTURING SEMICONDUCTOR AND SEMICONDUCTOR", the entire content of which is incorporated herein in its entirety by reference.

TECHNICAL FIELD

The present disclosure relates to a field of semiconductor technology, and in particular, to a method for manufacturing a semiconductor and a semiconductor.

BACKGROUND

In a process of continuously miniaturizing CMOS (Complementary Metal Oxide Semiconductor) devices according to Moore's Law, mass production of CMOS devices has entered a technical node of 5 to 3 nm. A use of a gate-all-around transistor device may effectively suppress a short-channel effect. In order to control the short-channel effect, an inner spacer formed on a gate is a necessary process module.

SUMMARY

The present disclosure provides a method for manufacturing a semiconductor and a semiconductor.

In an aspect, the present disclosure provides a method for manufacturing a semiconductor, including:

providing a substrate, where an active region trench is formed on the substrate, and a channel stack of a gate-all-around transistor, a sacrificial layer between the channel stack, a dummy gate on the channel stack, and a spacer on a sidewall of the sacrificial layer and a sidewall of the dummy gate are formed in the active region trench, and where the active region trench is divided into a source trench and a drain trench by the channel stack;

epitaxially growing a source crystal structure in the source trench and a drain crystal structure in the drain trench, and stopping epitaxial growth before crystal planes with different orientations of the source crystal structure intersect and crystal planes with different orientations of the drain crystal structure intersect during a growth process of the source crystal structure and the drain crystal structure; and filling a gap between the crystal planes with different orientations of the source crystal structure and a gap between the crystal planes with different orientations of the drain crystal structure by using an isotropic metal material, and forming a source of the gate-all-around transistor in the source trench and a drain of the gate-all-around transistor in the drain trench.

In an embodiment, the epitaxially growing a source crystal structure in the source trench and a drain crystal structure in the drain trench includes: epitaxially growing the source crystal structure on a bottom wall and a sidewall of the source trench, a surface of the channel stack and a surface of the spacer by using a reduced pressure vapor deposition epitaxial technology, and stopping the epitaxial growth before the crystal planes with different orientations of the source crystal structure intersect during the growth process of the source crystal structure; and epitaxially growing the drain crystal structure on a bottom wall and a sidewall of the drain trench, a surface of the channel stack and a surface of the spacer by using a reduced pressure vapor deposition epitaxial technology, and stopping the epitaxial growth before the crystal planes with different orientations of the drain crystal structure intersect during the growth process of the drain crystal structure.

In an embodiment, a material of the source crystal structure includes silicon or silicon germanium material, and a material of the drain crystal structure includes silicon or silicon germanium material.

In an embodiment, a growth thickness of the source crystal structure is within a range of 1 nm to 20 nm, and a growth thickness of the drain crystal structure is within a range of 1 nm to 20 nm.

In an embodiment, the method further includes: performing epitaxial growth and in situ doping on a surface of the source crystal structure and a surface of the drain crystal structure, after epitaxially growing the source crystal structure in the source trench and the drain crystal structure in the drain trench.

In an embodiment, the method further includes: depositing the isotropic metal material by using an atomic layer deposition, so as to fill the gap between the crystal planes with different orientations of the source crystal structure and the gap between the crystal planes with different orientations of the drain crystal structure.

In an embodiment, the isotropic metal material includes cobalt, titanium, tungsten or titanium nitride.

In an embodiment, the method further includes: after filling the gap between the crystal planes with different orientations of the source crystal structure and the gap between the crystal planes with different orientations of the drain crystal structure, planarizing the isotropic metal material by using a chemical mechanical polishing planarizing process; etching the isotropic metal material to a predetermined depth by using a metal etching-back process; growing a first dielectric layer on a surface of the isotropic metal material, and chemically and mechanically polishing the first dielectric layer until an upper surface of the dummy gate is exposed; removing the sacrificial layer and the dummy gate; and filling a void with a metal gate material to form a gate of the gate-all-around transistor, where the void is formed after removing the sacrificial layer and the dummy gate.

In an embodiment, the method further includes: forming a second dielectric layer on the first dielectric layer; and forming a source lead-out structure, a drain lead-out structure and a gate lead-out structure in the second dielectric layer. The source lead-out structure is electrically connected to the source, the drain lead-out structure is electrically connected to the drain, and the gate lead-out structure is electrically connected to the gate.

In another aspect, the present disclosure further provides a semiconductor. The semiconductor is manufactured using the method described above.

BRIEF DESCRIPTION OF THE DRAWINGS

FIG. 1 shows a flowchart of a method for manufacturing a semiconductor provided by embodiments of the present disclosure.

DETAILED DESCRIPTION OF EMBODIMENTS

Figure 2:
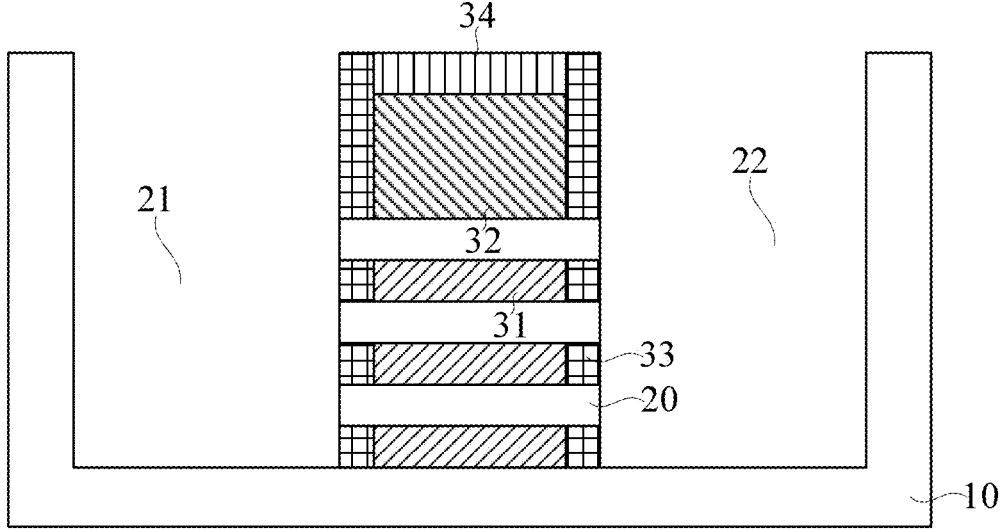
FIG. 2 to FIG. 8 show structural cross-sectional views of steps in a method for manufacturing a semiconductor provided by embodiments of the present disclosure.

In order to make the purpose, technical solution, and advantages of embodiments of the present disclosure clearer, the technical solution in embodiments of the present disclosure will be described clearly and completely with reference to the accompanying drawings. Embodiments described are only some embodiments of the present disclosure, rather than all embodiments. Based on the described embodiments of the present disclosure, all other embodiments derived by those of ordinary skill in the art without creative labor fall within the scope of protection of the present disclosure.

Generally, pure source/drain epitaxy of SiGe or Si material to form a source/drain is an important step. For example, a source/drain is formed by pure epitaxial growth of SiGe or Si material in a source/drain trench. The source/drain epitaxy includes growing from single crystal planes in multiple directions so as to form a source/drain material through contacting and merging, and an intersection of crystal planes with different orientations within the source/drain material may generate defects such as stacking faults. Therefore, it is easy to generate a large number of stacking faults and other defects at growth overlaps of the single crystal planes, thereby increasing a parasitic resistance of the source/drain, reducing a driving capability of the device, and increasing power consumption. The present disclosure provides a method for manufacturing a semiconductor and a semiconductor, so as to at least avoid defects such as stacking faults caused by an intersection of crystal planes with different orientations.

In order to facilitate the understanding of a method for manufacturing a semiconductor provided by embodiments of the present disclosure, the application scenario of the manufacturing method provided by embodiments of the present disclosure is explained below. The manufacturing method is applied to the process for manufacturing a source of a gate-all-around transistor and a drain of the gate-all-around transistor. The method for manufacturing the semiconductor will be described in detail below with reference to the accompanying drawings.

With reference to FIG. 1 to FIG. 8, a method for manufacturing a semiconductor provided by embodiments of the present disclosure includes steps S10 to S30.

In step S10, a substrate 10 is provided, and an active region trench is formed on the substrate 10. A channel stack 20 of a gate 23-all-around transistor, a sacrificial layer 31 between the channel stack 20, a dummy gate 32 on the channel stack 20, and a spacer 33 on a sidewall of the sacrificial layer 31 and a sidewall of the dummy gate 32 are formed in the active region trench. The active region trench is divided into a source trench 21 and a drain trench 22 by the channel stack 20.

In step S20, a source crystal structure 211 is epitaxially grown in the source trench 21 and a drain crystal structure 221 is epitaxially grown in the drain trench 22, and the epitaxial growth is stopped before crystal planes with different orientations of the source crystal structure 211 intersect and crystal planes with different orientations of the drain crystal structure 221 intersect during a growth process of the source crystal structure 211 and the drain crystal structure 221.

In step S30, a gap between the crystal planes with different orientations of the source crystal structure 211 and a gap between the crystal planes with different orientations of the drain crystal structure 221 are filled by using an isotropic metal material, and a source 212 of the gate 23-all-around transistor is formed in the source trench 21 and a drain 222 of the gate 23-all-around transistor is formed in the drain trench 22.

In the above solution, during a process of epitaxially growing a source crystal structure 211 in the source trench 21 and a drain crystal structure 221 in the drain trench 22, the epitaxial growth is stopped before the crystal planes with different orientations intersect. Then, the gap between the crystal planes with different orientations is filled using an isotropic metal material, and a source 212 of the gate 23-all-around transistor is formed in the source trench 21 and a drain 222 of the gate 23-all-around transistor is formed in the drain trench 22. Different from that in related art, a source/drain is formed by combining an epitaxial thin layer with a filling metal, which not only reduces an existing fully epitaxial semiconductor material for the source/drain, but also avoid defects such as stacking faults caused by an intersection of crystal planes with different orientations, thereby reducing a parasitic resistance of the source/drain, improving the driving capability of the device, and reducing the power consumption of the device. The above steps will be described in detail below with reference to the accompanying drawings.

As shown in FIG. 1 and FIG. 2, a substrate 10 is provided, and an active region trench is formed on the substrate 10. A channel stack 20 of a gate 23-all-around transistor is formed in the active region trench. The channel stack 20 includes a plurality of channels, and the plurality of channels are stacked at intervals to form the channel stack 20 as shown in FIG. 2. A material of the channel stack 20 may include, for example, silicon, or materials such as silicon germanium, which are not specifically limited in the present disclosure. A sacrificial layer 31 is formed between the channel stack 20. For example, a sacrificial layer 31 is filled in a space between adjacent channels. A dummy gate 32 is formed on the channel stack 20. The dummy gate 32 is not a real gate 23, but a sacrificial structure used as intermediate transition in a process of manufacturing the gate 23-all-around transistor. Moreover, a spacer 33 is formed on a sidewall of the sacrificial layer 31 and a sidewall of the dummy gate 32. The spacer 33 is used to protect the gate 23. Continuing to refer to FIG. 2, the active region trench is divided into a source trench 21 and a drain trench 22 by the channel stack 20. The source 212 of the gate 23-all-around transistor is formed in the source trench 21, and the drain 222 of the gate 23-all-around transistor is formed in the drain trench 22. In addition, with reference to FIG. 2, a hard mask 34 may be formed on the dummy gate 32 to prevent damage to the dummy gate 32 in subsequent processing thereby affecting the quality of the resultant gate 23.

Figure 3:
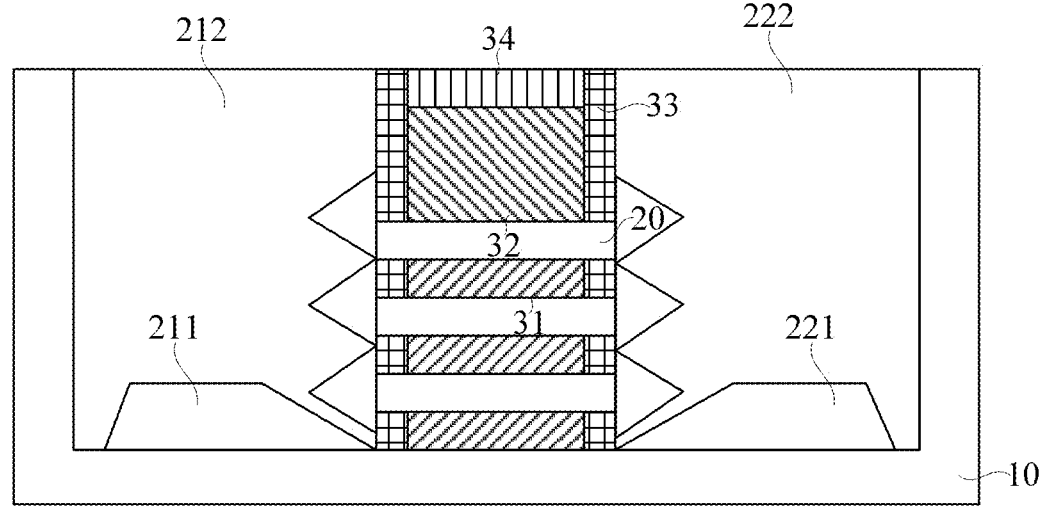

Next, with reference to FIG. 1 and FIG. 3, a source crystal structure 211 is epitaxially grown in the source trench 21 and a drain crystal structure 221 is epitaxially grown in the drain trench 22. Before crystal planes with different orientations of the source crystal structure 211 intersect and crystal planes with different orientations of the drain crystal structure 221 intersect during a growth process of the source crystal structure 211 and the drain crystal structure 221, the epitaxial growth is stopped, thereby avoiding defects such as stacking faults caused by the intersection of crystal planes with different orientations. Due to different materials of the epitaxial growth on the bottom wall and the sidewall, the orientations of the crystal planes during the epitaxial growth process are different. By stopping the epitaxial growth before the crystal planes with different orientations of the source crystal structure 211 intersect and the crystal planes with different orientations of the drain crystal structure 221 intersect during the growth process of the source crystal structure 211 and the drain crystal structure 221, the crystal planes with different orientations are not in contact with each other, so as to prevent crystal planes with different orientations from intersecting, thereby avoiding defects such as stacking faults caused by the intersection of crystal planes with different orientations.

When the source crystal structure 211 is epitaxially grown in the source trench 21, for example, the source crystal structure 211 is epitaxially grown on a bottom wall and a sidewall of the source trench 21, a surface of the channel stack 20 and a surface of the spacer 33 by using a reduced pressure vapor deposition epitaxial technology, and the epitaxial growth is stopped before the crystal planes with different orientations of the source crystal structure 211 intersect during the growth process of the source crystal structure 211. Similarly, when the drain crystal structure 221 is epitaxially grown in the drain trench 22, the drain crystal structure 221 is epitaxially grown on a bottom wall and a sidewall of the drain trench 22, a surface of the channel stack 20 and a surface of the spacer 33 by using a reduced pressure vapor deposition epitaxial technology, and the epitaxial growth is stopped before the crystal planes with different orientations of the drain crystal structure 221 intersect during the growth process of the drain crystal structure 221. This can facilitate the control of epitaxial growth and stop of growth of the source crystal structure 211 and the drain crystal structure 221, thereby improving the quality of the grown source crystal structure 211 and the grown drain crystal structure 221.

A material of the source crystal structure 211 may include silicon or silicon germanium material, and a material of the drain crystal structure 221 may include silicon or silicon germanium material, so as to improve the quality of the grown source crystal structure 211 and the grown drain crystal structure 221. A growth thickness of the source crystal structure 211 may be between 1 nm to 20 nm, and a growth thickness of the drain crystal structure 221 may be between 1 nm to 20 nm. For example, the growth thickness of the source crystal structure 211 and the growth thickness of the drain crystal structure 221 may be any thickness between 1 nm to 20 nm, such as 1 nm, 5 nm, 10 nm, 15 nm, 20 nm, etc., so as to improve the quality of the grown source crystal structure 211 and the grown drain crystal structure 221.

The method may also include: performing epitaxial growth and in situ doping on a surface of the source crystal structure 211 and a surface of the drain crystal structure 221, after epitaxially growing the source crystal structure 211 in the source trench 21 and the drain crystal structure 221 in the drain channel 22. Different elements are doped in situ according to different transistor types. For example, for PMOS, B is doped in situ, and for NMOS, P is doped in situ.

Next, with reference to FIG. 1 and FIG. 3, a gap between the crystal planes with different orientations of the source crystal structure 211 and a gap between the crystal planes with different orientations of the drain crystal structure 221 are filled using an isotropic metal material, and a source 212 of the gate 23-all-around transistor is formed in the source trench 21 and a drain 222 of the gate 23-all-around transistor is formed in the drain trench 22. For example, when filling the gap between the crystal planes with different orientations of the source crystal structure 211 and the gap between the crystal planes with different orientations of the drain crystal structure 221 by using the isotropic metal material, the isotropic metal material may be deposited by using an atomic layer deposition, so as to fill the gap between the crystal planes with different orientations of the source crystal structure 211 and the gap between the crystal planes with different orientations of the drain crystal structure 221, thereby facilitating filling the gaps between the crystal planes with different orientations and improving the quality of the resultant source 212 and drain 222. The isotropic metal material may be cobalt, titanium, tungsten, or titanium nitride, thereby improving the quality of the resultant source 212 and drain 222.

Figure 4:
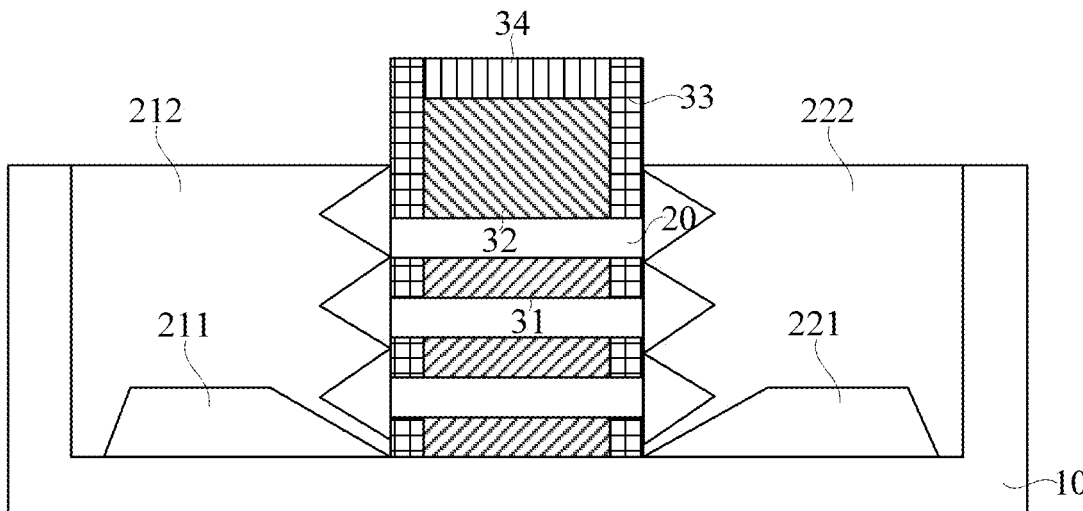
Figure 5:
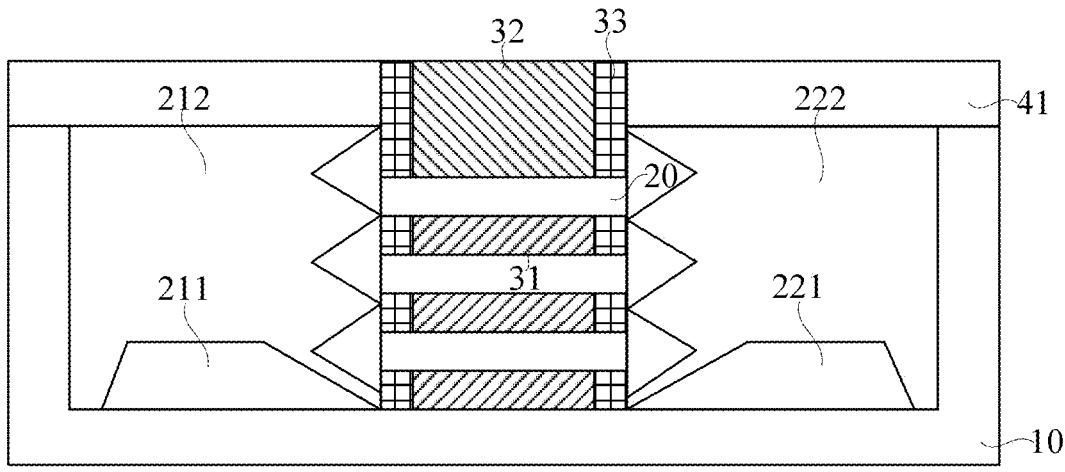
Figure 6:
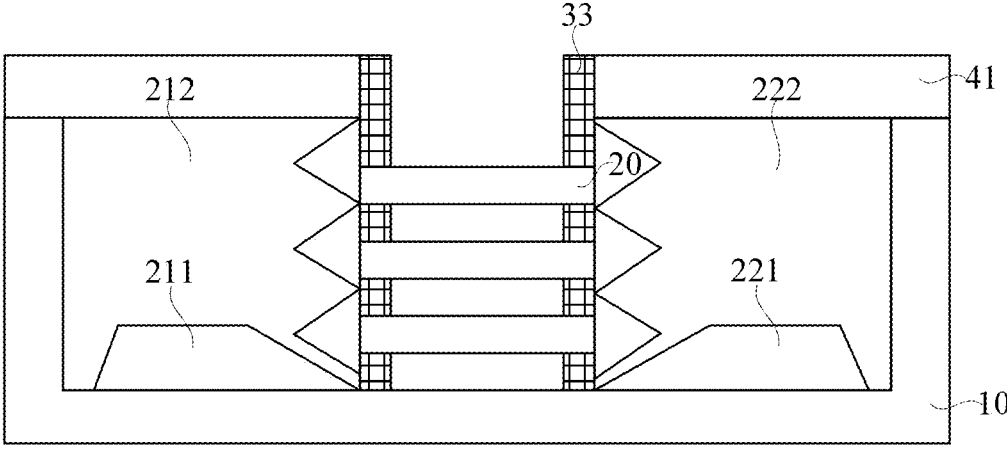
Figure 7:
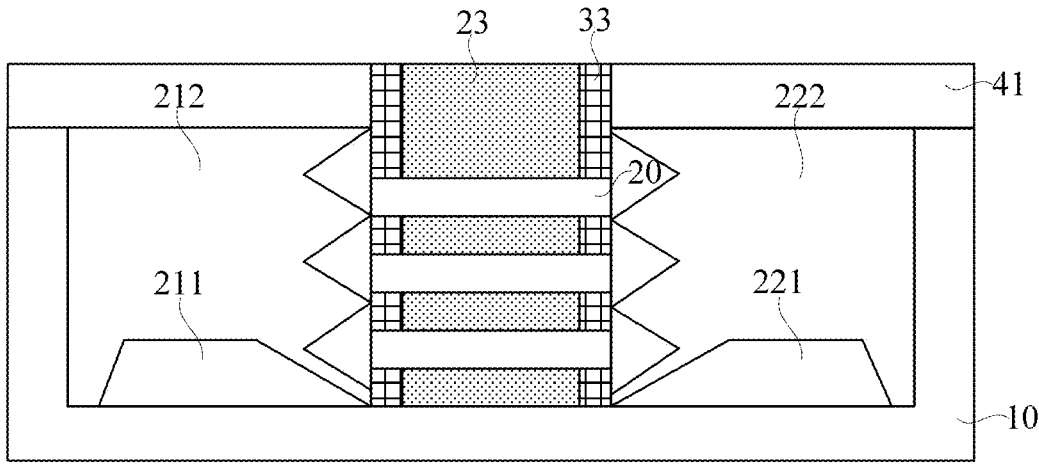

With reference to FIG. 3, the method may also include: after filling the gap between the crystal planes with different orientations of the source crystal structure 211 and the gap between the crystal planes with different orientations of the drain crystal structure 221, planarizing the isotropic metal material by using a chemical mechanical polishing planarizing process. For example, as shown in FIG. 3, the chemical mechanical polishing planarizing process may be used to polish the isotropic metal material until an upper surface of the hard mask 34 is exposed. Afterwards, as shown in FIG. 4, the isotropic metal material is etched to a predetermined depth by using a metal etching-back process. Afterwards, as shown in FIG. 5, a first dielectric layer 41 is grown on a surface of the isotropic metal material, and the first dielectric layer 41 is chemically and mechanically polished until an upper surface of the dummy gate 32 is exposed. Afterwards, as shown in FIG. 6, the sacrificial layer 31 and the dummy gate 32 are removed. Afterwards, as shown in FIG. 7, a void is filled with a metal gate material to form a gate 23 of the gate 23-all-around transistor, where the void is formed after removing the sacrificial layer 31 and the dummy gate 32. It is convenient to form the gate 23 of the gate 23-all-around transistor.

Figure 8:
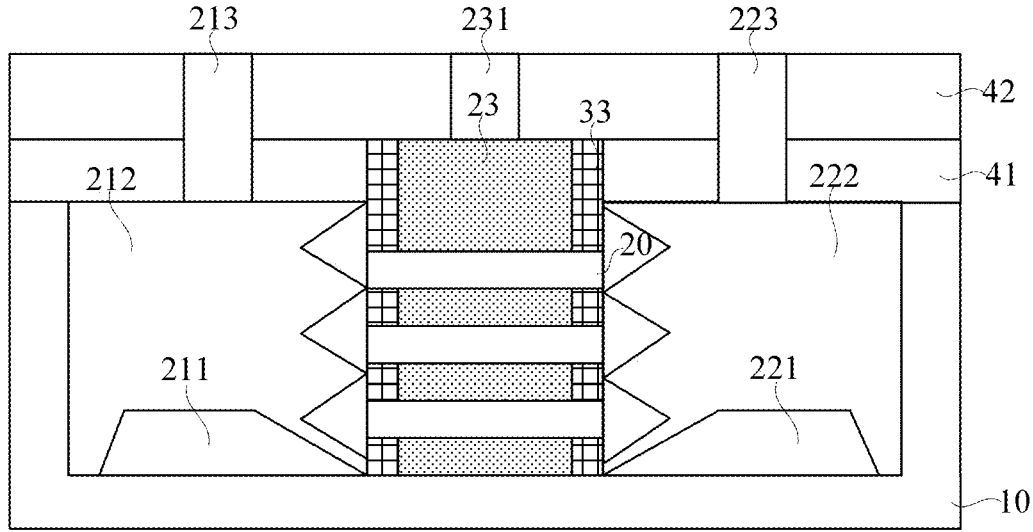

As shown in FIG. 8, the method may also include: forming a second dielectric layer 42 on the first dielectric layer 41, and forming a source lead-out structure 213, a drain lead-out structure 223 and a gate lead-out structure 231 in the second dielectric layer 42. The source lead-out structure 213 is electrically connected to the source 212, the drain lead-out structure 223 is electrically connected to the drain 222, and the gate lead-out structure 231 is electrically connected to the gate 23. It is possible to protect the gate 23, source 212 and drain 222 of the gate 23-all-around transistor. The source lead-out structure 213, the drain lead-out structure 223 and the gate lead-out structure 231 may be, for example, metal conductive columnar structures, etc.

In various embodiments shown above, during a process of epitaxially growing a source crystal structure 211 in the source trench 21 and a drain crystal structure 221 in the drain trench 22, the epitaxial growth is stopped before the crystal planes with different orientations intersect. Then, the gap between the crystal planes with different orientations is filled using an isotropic metal material, and a source 212 of the gate 23-all-around transistor is formed in the source trench 21 and a drain 222 of the gate 23-all-around transistor is formed in the drain trench 22. Different from that in related art, a source/drain is formed by combining an epitaxial thin layer with a filling metal, which not only reduces an existing fully epitaxial semiconductor material for the source/drain, but also avoid defects such as stacking faults caused by an intersection of crystal planes with different orientations, thereby reducing a parasitic resistance of the source/drain, improving the driving capability of the device, and reducing the power consumption of the device.

In addition, embodiments of the present disclosure further provide a semiconductor. With reference to FIG. 1 and FIG. 8, the semiconductor is manufactured using any of the above manufacturing methods. During a process of epitaxially growing a source crystal structure 211 in the source trench 21 and a drain crystal structure 221 in the drain trench 22, the epitaxial growth is stopped before the crystal planes with different orientations intersect. Then, the gap between the crystal planes with different orientations is filled using an isotropic metal material, and a source 212 of the gate 23-all-around transistor is formed in the source trench 21 and a drain 222 of the gate 23-all-around transistor is formed in the drain trench 22. Different from that in related art, a source/drain is formed by combining an epitaxial thin layer with a filling metal, which not only reduces an existing fully epitaxial semiconductor material for the source/drain, but also avoid defects such as stacking faults caused by an intersection of crystal planes with different orientations, thereby reducing a parasitic resistance of the source/drain, improving the driving capability of the device, and reducing the power consumption of the device.

The above is only a specific embodiment of the present disclosure, but the scope of protection of the present disclosure is not limited to this. Any changes or replacements that may be easily imagined by those of ordinary skill in the art familiar with the technical field within the scope of protection of the present disclosure should be covered within the scope of protection of the present disclosure. Therefore, the scope of protection of the present disclosure should be based on the scope of protection of the claims.

What is claimed is:

1. A method for manufacturing a semiconductor, comprising:
   providing a substrate, wherein an active region trench is formed on the substrate, and a channel stack of a gate-all-around transistor, a sacrificial layer between the channel stack, a dummy gate on the channel stack, and a spacer on a sidewall of the sacrificial layer and a sidewall of the dummy gate are formed in the active region trench, and wherein the active region trench is divided into a source trench and a drain trench by the channel stack;
   epitaxially growing a source crystal structure in the source trench and a drain crystal structure in the drain trench, and stopping epitaxial growth before crystal planes with different orientations of the source crystal structure intersect and crystal planes with different orientations of the drain crystal structure intersect during a growth process of the source crystal structure and the drain crystal structure; and
   filling a gap between the crystal planes with different orientations of the source crystal structure and a gap between the crystal planes with different orientations of the drain crystal structure by using an isotropic metal material, and forming a source of the gate-all-around transistor in the source trench and a drain of the gate-all-around transistor in the drain trench.

2. The method of claim 1, wherein the epitaxially growing a source crystal structure in the source trench and a drain crystal structure in the drain trench comprises:
   epitaxially growing the source crystal structure on a bottom wall and a sidewall of the source trench, a surface of the channel stack and a surface of the spacer by using a reduced pressure vapor deposition epitaxial technology, and stopping the epitaxial growth before the crystal planes with different orientations of the source crystal structure intersect during the growth process of the source crystal structure; and
   epitaxially growing the drain crystal structure on a bottom wall and a sidewall of the drain trench, a surface of the channel stack and a surface of the spacer by using a reduced pressure vapor deposition epitaxial technology, and stopping the epitaxial growth before the crystal planes with different orientations of the drain crystal structure intersect during the growth process of the drain crystal structure.

3. The method of claim 2, wherein a material of the source crystal structure comprises silicon or silicon germanium material, and a material of the drain crystal structure comprises silicon or silicon germanium material.

4. The method of claim 3, wherein a growth thickness of the source crystal structure is within a range of 1 nm to 20 nm, and a growth thickness of the drain crystal structure is within a range of 1 nm to 20 nm.

5. The method of claim 2, further comprising:
   performing epitaxial growth and in situ doping on a surface of the source crystal structure and a surface of the drain crystal structure, after epitaxially growing the source crystal structure in the source trench and the drain crystal structure in the drain trench.

6. The method of claim 1, further comprising:
   depositing the isotropic metal material by using an atomic layer deposition, so as to fill the gap between the crystal planes with different orientations of the source crystal structure and the gap between the crystal planes with different orientations of the drain crystal structure.

7. The method of claim 6, wherein the isotropic metal material comprises cobalt, titanium, tungsten or titanium nitride.

8. The method of claim 1, further comprising: after filling the gap between the crystal planes with different orientations of the source crystal structure and the gap between the crystal planes with different orientations of the drain crystal structure,
   planarizing the isotropic metal material by using a chemical mechanical polishing planarizing process;
   etching the isotropic metal material to a predetermined depth by using a metal etching-back process;
   growing a first dielectric layer on a surface of the isotropic metal material, and chemically and mechanically polishing the first dielectric layer until an upper surface of the dummy gate is exposed;
   removing the sacrificial layer and the dummy gate; and
   filling a void with a metal gate material to form a gate of the gate-all-around transistor, wherein the void is formed after removing the sacrificial layer and the dummy gate.

9. The method of claim 8, further comprising:
   forming a second dielectric layer on the first dielectric layer; and
   forming a source lead-out structure, a drain lead-out structure and a gate lead-out structure in the second dielectric layer,
   wherein the source lead-out structure is electrically connected to the source, the drain lead-out structure is electrically connected to the drain, and the gate lead-out structure is electrically connected to the gate.

10. A semiconductor manufactured using the method of claim 1.

* * * * *